Figure 1:
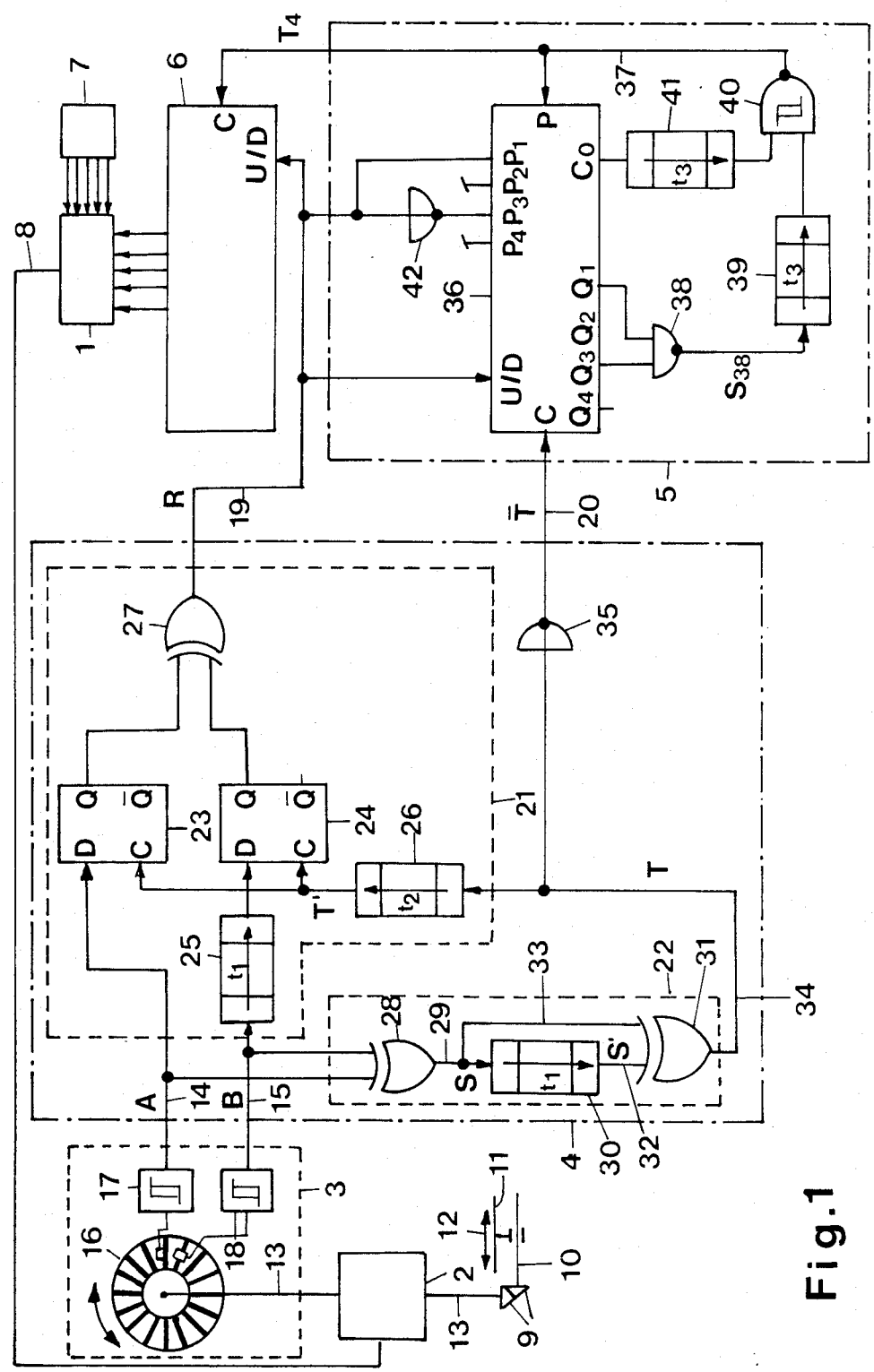

United States Patent [19]

Krogh et al.

[11] Patent Number: 4,491,826

[45] Date of Patent: Jan. 1, 1985

[54] INCREMENTAL DIGITAL CONVERTER

[75] Inventors: Egon Krogh, Sonderborg; Knud Blohm, Nordborg, both of Denmark

[73] Assignee: Danfoss A/S, Nordborg, Denmark

[21] Appl. No.: 495,090

[22] Filed: May 16, 1983

[51] Int. Cl.³ .................. H03D 13/00; H03K 13/02
[52] U.S. Cl. ...................... 340/347 P; 250/231 SE
[58] Field of Search .................. 340/347 M, 347 P; 250/231 SE

[56] References Cited

U.S. PATENT DOCUMENTS

| | | | |
|---|---|---|---|
| 3,967,271 | 6/1976 | Day | 340/347 M X |
| 4,194,184 | 3/1980 | Hartmann et al. | 340/347 P |
| 4,266,215 | 3/1981 | Adams | 340/347 P |
| 4,308,500 | 12/1981 | Avins | 340/347 P X |

OTHER PUBLICATIONS

Millman et al., Pulse and Digital Circuits, McGraw-Hill Book Co., Inc., 1956, pp. 40–47.

Primary Examiner—T. J. Sloyan
Attorney, Agent, or Firm—Wayne B. Easton

[57] ABSTRACT

An incremental digital converter for converting two phase displaced signals of a pulse generator, which signals represent the position and direction of an object moved in two opposite directions, to a parameter which represents the position digitally. The converter includes a reversible position counter and a signal generator which derives from the phase displaced signals a direction signal for determining the counting direction of the counter and timing pulses to be counted by the counter.

3 Claims, 4 Drawing Figures

INCREMENTAL DIGITAL CONVERTER

The invention relates to an incremental digital converter for converting two phase-displaced position signals of a pulse generator which represent the position and direction of an object moved in two opposite directions to a parameter representing the position digitally, comprising a reversible position counter and a signal generator which derives a direction signal determining the counting direction of the position counter and timing pulses to be counted by the position counter, has a flank detector deriving a timing pulse from each flank of the one position signal and a direction discriminator, to which the timing pulses of the flank detector on the one hand and the position signals on the other hand can be fed to produce the direction signal, and which has a flip-flop to which the one position signal can be fed.

The pulse generator usually has a very high resolving capacity so that a multiplicity of position pulses is already produced upon extremely slight movement of the movable object. By reason of this high resolving capacity, position pulses can also be produced upon movement of the object in a direction opposite to the desired direction of movement, for example caused by shaking or vibrations when the object is at a standstill. In a known converter of the aforementiond kind, these erroneous pulses (false direction pulses) are summated in a reversible counter provided solely for the erroneous pulses when detecting movement against the set direction and while blocking the delivery of the counting pulses to be counted by the position counter. After the disruptive motion has changed to the set direction, the delivery of counting pulses to the position counter is released only when the number of counting pulses that has occurred exceeds the sum of the counting pulses that occurred in the opposite direction. In this case, the count of the position counter does not accurately correspond to the position of the object at all times, certainly not while the moved object is traveling in the wrong direction and, upon reversal to the correct direction of movement, not until it has again reached the original reversal point. If the erroneous pulse counter is still filled upon commencement of movement of the movable object, it must first be counted to the empty condition by 'correct direction pulses' before the actual existing position counting operation can commence. This is a disadvantage for many applications, e.g. in the index control of a turntable and many machine tool controls, because the first part of the movement will not be recorded. Further, in the known converter the timing pulses are derived only from the flanks of the one position signal. This does not permit reliable phase discrimination of the position signals to detect the direction of movement because, for one thing, the tolerances in the scanning conditions of the position signals are comparatively large, e.g. ±10%. For another, the phase displacement of the two position signals can depart ±45°, i.e. by 50%, from the normal phase displacement of 90°. Such tolerance errors are directly incorporated in evaluating the existing value of the position.

The invention is based on the problem of providing a converter of the aforementioned kind which more accurately detects the position of the movable object even during movement in the wrong direction.

According to the invention, this problem is solved in that the one flip-flop is a D flip-flop having its D input connected to the output of a delay element to which the one position signal can be fed directly, that the direction discriminator comprises a second D flip-flop to the D input of which the other position signal can be fed directly and a summating element following the two D flip-flops, that the flank detector likewise produces a timing pulse at each flank of the other position signal, and that the pulses of the flank detector can be fed to the timing inputs of the D flip-flops.

In this construction, the count of the position counter corresponds to the existing value of the position of the movable object at all times. A counter for the erroneous pulses is dispensed with. To scan all flanks of both position signals has the advantage that a change in the direction of movement of the movable object is detected as early as possible with highest resolving power. The discrimination of the direction of movement takes place through the very inexpensive use of the D flip-flops and the summating element. The delay element ensures that the value of the one position signal existing just in front of one flank of that signal can, for the purpose of direction discrimination, be compared in the summating element with the value of the other position signal existing in front of the following flank of the other position signal. Similarly, the amplitude existing in front of one flank of the one position signal can be compared with the amplitude existing directly after one flank of the other position signal.

It is preferred that, between the output of the flank detector and the timing input of the one D flip-flop, there is a delay element of which the delay period is less than the delay period of the delay element preceding the D input. In this way one ensures that the amplitude of the other position signal has stabilised directly behind the flank of this position signal before scanning.

The delay elements may be integrating RC elements. Their construction is particularly simple because one ohmic resistor and one capacitor will suffice.

Preferably, a frequency divider dividing the pulse frequency by four is disposed between the output of the flank detector and the timing pulse input of the position counter. This frequency divider removes frequency fluctuations in the timing pulses derived from all the flanks of the position signals as caused by tolerances in the scanning conditions of both position signals because it transmits only every fourth timing pulse for counting by the position counter and the time intervals of all four timing pulses are, despite different scanning conditions of both position signals, constant for a constant speed of the movable object.

The frequency divider may likewise comprise a reversible pulse counter of which the counting direction input is connected to the output of the direction discriminator. The direction of counting of this pulse counter is therefore reversed simultaneously with reversal of the direction of the movable object so that erroneous counts are avoided upon reversal of the direction of movement.

Figure 2:
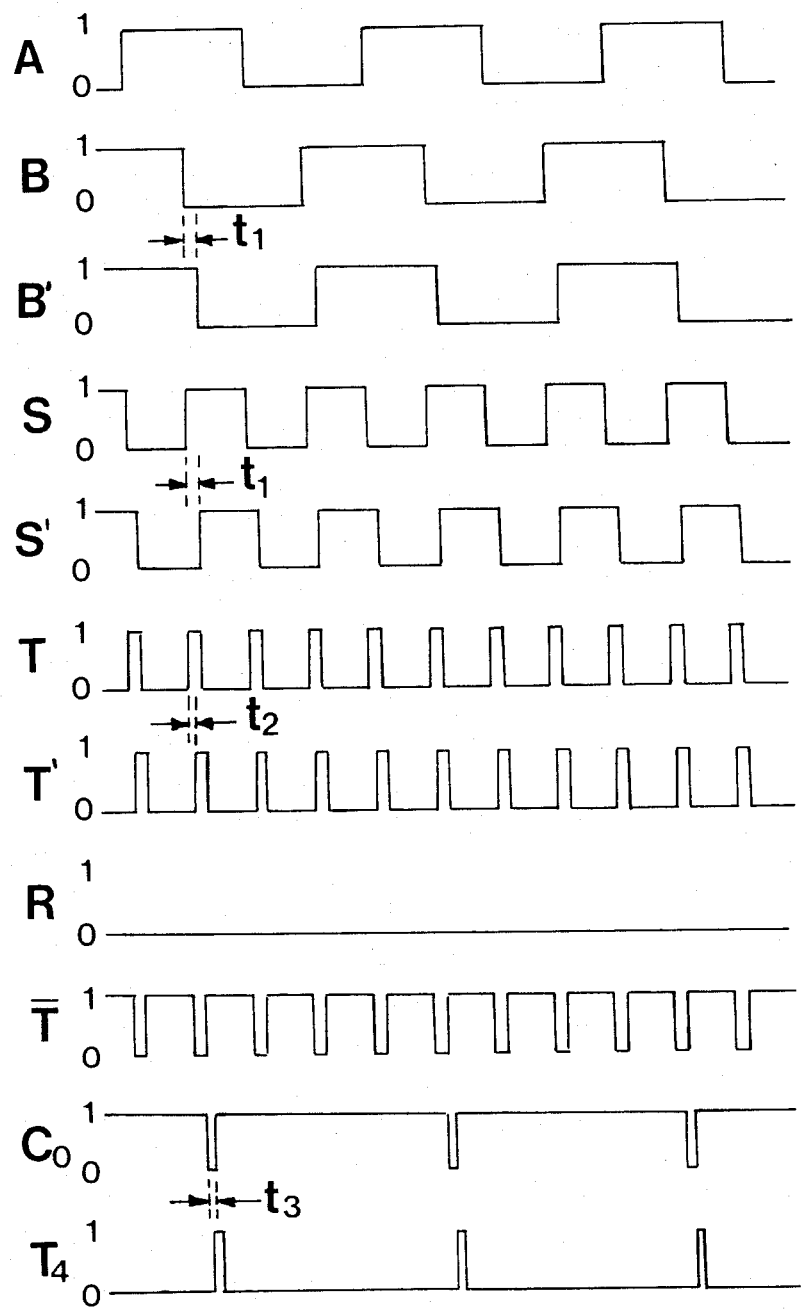
Figure 3:
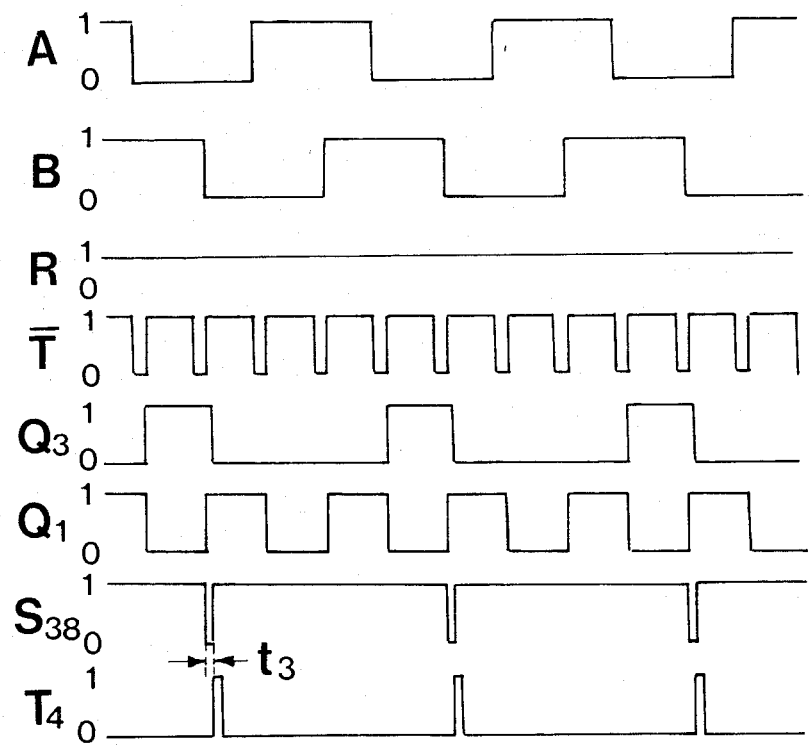
Figure 4:
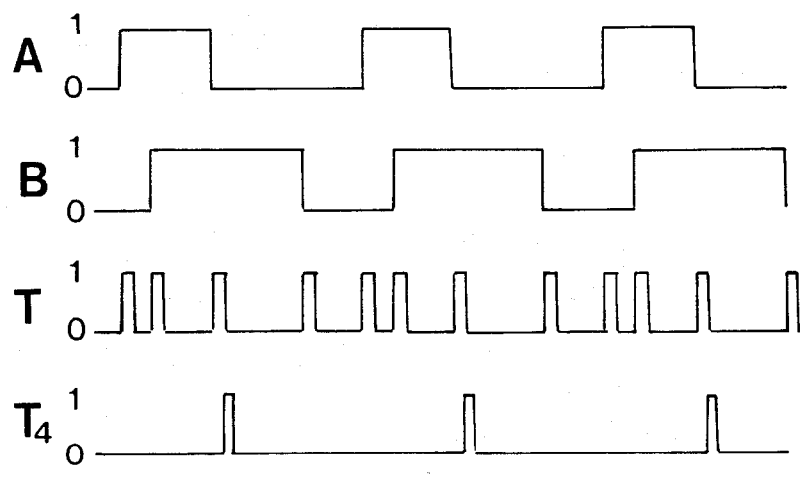

The invention and its embodiments will now be described in more detail with reference to the drawing of a preferred example, wherein:

FIG. 1 is a block diagram of a position control circuit with a converter according to the invention, and FIGS. 2 to 4 illustrate time diagrams for signals occurring in the position control circuit of FIG. 1.

The position control circuit shown in FIG. 1 comprises a regulator 1, a servo-motor 2, a pulse generator 3, a signal generator 4, a frequency divider 5, a position counter 6 and a desired value generator 7.

A desired value digitally predetermined by the desired value generator 7 is compared in the regulator 1 with an existing position value digitally predetermined by the position counter 6. A difference arising out of the comparison, i.e. the control departure, is converted to an analogous servo-signal and fed to the servo-motor 2 by way of a conduit 8. Depending on this servo-signal, the servo-motor moves a movable object 11, e.g. the table of a machine tool, in the one or other direction indicated by the double arrow 12, possibly by way of gearing comprising bevel gears 9 and a spindle 10.

The angular position, the number of revolutions and the direction of rotation of shaft 13 of the servo-motor 2 and thus the position and direction of movement of the movable object 11 are converted by the pulse generator 3 which is likewise coupled to the shaft 13 into two position signals A and B which are displaced by 90° in phase and have a square behaviour and a scanning ratio (ratio of the duration of the pulse to the duration of the period) of about 50%. Depending on whether the one position signal A has a phase position which precedes or follows the other position signal B, this means that the servo-motor 2 or the movable object 11 is driven in the one or other direction. The number of pulses of both position signals A and B since commencement of motion is a measure of the distance covered or the position of the movable object 11 in relation to the starting point of the movement.

For this purpose, the pulse generator 3 comprises a graduated grid scale 16 of which the grid is scanned by sensors which are spatially staggered with respect to each other corresponding to the desired 90° phase displacement of the position signals and converted to the rectangular position signals A and B by way of pulse formers 17, 18.

The position signals A and B are fed to the signal generator 4. The latter derives a direction signal R in an output conduit 19 from the sign of the relative phase displacement of the position signals A and B and a respective timing pulse $\overline{T}$ in a second output conduit 20 from all the flanks of both position signals A and B.

For this purpose, the signal generator 4 comprises a direction discriminator 21 and a flank detector 22. The direction discriminator 21 contains two D flip-flops 23 and 24, a delay element 25 preceding the D input of the flip-flop 24, a second delay element 26 preceding the timing input C of both flip-flops 23 and 24, and a summating element 27 in the form of an EXCLUSIVE-OR linking element connected to the Q outputs (the 'reel' outputs) of both flip-flops 23 and 24. The delay period $t_1$ of the delay element 25 is substantially shorter than half the smallest period of one of the position signals A and B and the delay period $t_2$ is shorter than $t_1$. The delay elements 25 and 26 bring about a delay in the front and rear flanks of their input signals by the same delay period $t_1$ or $t_2$.

The flank detector 22 comprises on the input side an EXCLUSIVE-OR linking element 28 connected to the conduits 14 and 15, a delay element 30 having the same delay period $t_1$ as the delay element 25 and connected by way of a conduit 29 to the output of the EXCLUSIVE-OR linking element 28, and a further EXCLUSIVE-OR linking element 31 of which the one input is connected to the output of the delay element 30 by way of a conduit 32 and the other input is connected by way of a conduit 33 and the conduit 29 directly to the output of the EXCLUSIVE-OR linking element 28. The timing pulses T produced at the output of the flank detector 22 or the EXCLUSIVE-OR linking element 31 are fed by a conduit 34 on the one hand to the input of the delay element 26 and on the other hand by way of a NOT element 35 to the output conduit 20 in the form of inverting timing pulses $\overline{T}$.

The frequency divider 5 comprises a reversible pulse counter 36 which divides by four the frequency of the timing pulses $\overline{T}$ fed to its timing input C by way of the conduit 20, i.e. on each fourth timing pulse $\overline{T}$, it produces an output timing pulse $T_4$ in an output conduit 37 which is connected to the timing input C of the position counter 6.

Further, the frequency divider 5 comprises a NAND linking element 38 which interlinks the output signals $Q_1$ and $Q_3$ of the pulse counter 36 and, by way of a delay element 39, is connected to the input of a NAND element 40 with trigger behaviour.

Further, the output signal $C_o$ is fed by way of a further delay element 41 to the other input of the NAND linking element 40. The delay periods $T_3$ of the delay elements 39 and 41 are shorter than $t_1$ but could also be equal thereto.

The output of the NAND linking element 40 is connected by way of the conduit 37 to a setting input P of the pulse counter 36 which, upon receiving a 1-signal, ensures that the counter 36 is preset to a number which is applied to the inputs $P_1$ to $P_4$ in the form of binary signals. This number is the binary number '0001', i.e. the decimal numeral '1', or the binary number '0100', i.e. the decimal numeral '4', depending on whether the direction signal R fed to the input $P_1$ directly or inversely fed to the input $P_3$ by way of a NOT element 42 is a 1-signal or a NOT-signal.

The direction signal R is in addition fed to counting direction control inputs $U_D$ of counters 6 and 36, the counters counting 'forwards' upon a 1-signal R and 'backwards' upon a 0-signal R.

The function of the FIG. 1 control circuit will now be described in more detail, particularly that of the incremental digital converter formed by the signal generator 4, the frequency divider 5 and the position counter 6, with simultaneous reference to FIGS. 2 to 4.

From the position signals A and B according to FIG. 2, of which the relative phase position may require backwards counting of the position counter 6 (R='0'), the EXCLUSIVE-OR linking element 28 produces the signal S (FIGS. 1 and 2) of which the frequency is twice that of one of the position signals A and B and which likewise has a scanning ratio of 0.5. A signal S' (FIGS. 1 and 2) delayed by the time $t_1$ relatively to the signal S therefore occurs at the output of the delay element 30. In the linking element 31, this signal S' is again subjected to an EXCLUSIVE-OR linkage with the undelayed signal S, so that the timing pulses T (FIGS. 1 and 2) result in conduit 34, of which the frequency is four times as high as that of the position signals A and B. The front flanks of the timing pulses T coincide with all the flanks of the position signals A and B. The duration of the timing pulses T corresponds to the delay periods $t_1$ of the delay element 30. The timing pulses $\overline{T}$ are inverted by NOT element 35 because continued switching of counter 36 is by the front flanks (the 0-1 transitions) of the timing pulses $\overline{T}$ fed to the timing input C but should be somewhat retarded in relation to the flanks of signals A and B so that, after an amplitude change of the direction signal R synchronised with the front flank of the timing signal T, its amplitude has stablised before counting commences.

In addition, the timing pulses T are fed to the timing inputs C of flip-flops 23 and 24 as timing pulses T′ delayed by the delay period $t_2$. Whereas the position signal A is fed directly to the D input of flip-flop 23, position signal B is fed to the D input of flip-flop 24 as a position signal B′ delayed by the period $t_1$ by the delay element 25. Storing the information available at the D inputs in the flip-flops 23 and 24 is effected with the respective front flank (the 0-1 transition) of a timing pulse T′ fed to the timing input C, i.e. when there is a 1-signal at the D input of one of the D flip-flops 23 and 24 and a timing pulse subsequently occurs at the timing input C, the respective D flip-flop is so triggered that a 1-signal likewise occurs at its Q output. If it already had a 1-signal at its Q output, this 1-signal is maintained. Every change in information (1-0 or 0-1 transition) at the D input is stored only with the following timing pulse T′. The summating element 27 will always produce a direction signal R = '1' ('forwards counting'), when the signals at the Q outputs of flip-flops 23 and 24 differ, otherwise the direction signal R = '0' ('backwards counting'). Thus, if the position signal B directly in front of one flank of the position signal B coincides with the position signal A in front of the following flank of the position signal A, or if the position signal B behind a flank of the position signal B coincides with the position signal A directly behind the following flank of position signal A, the summating element 27 will produce an O signal ('backwards counting'). Since the timing pulses are derived from the flanks of the position signals, but a timing pulse is also to detect (store) the value of the position signal directly in front of the flank of the position signal that initiates the timing pulse, the position signal B is delayed by the delay element 25 by the period $t_1$ so that the timing pulses T derived from the flanks of the position signal B always occur $t_1$ before the respective flank of the delayed (actually scanned) position signal B′ (compare B′ and T in FIG. 2). On the other hand, the timing pulses are also to record a value of the position signal A occurring directly behind the initiating flank of position signal A. Consequently, the timing pulses T′ actually scanning the position signals A and B are additionally delayed by the period $t_2$ relatively to the timing pulses T derived from the flanks of the position signals, thereby to ensure that, after the flank of the position signal A initiating the respective timing pulse, the position signal A has stabilised at the new value before the timing pulse T′. Since, as shown, the timing pulses T′ must also lie in front of the flanks of the position signals B initiating same, $t_2$ is selected to be smaller than $t_1$. Instead of the EXCLUSIVE-OR linking element 27 detecting the antivalence (inequality) of the position signals A and B after the switching function ($\overline{A}$ & B) v (A & $\overline{B}$), wherein '&' means an AND linkage and 'v' means an OR linkage, a linkage element can be provided as a summating element 27 which detects the equivalents after the switching function (A & B) v ($\overline{A}$ & $\overline{B}$) if the counters 6 and 36, which both contain the direction signal R, are to count forwards instead of backwards in the relative phase position of the position signals A and B represented by FIG. 2.

The purpose of the frequency divider 5 will be explained briefly with reference to FIG. 4. In practice, the scanning conditions of position signals A and B can deviate from 50%, e.g. by reason of manufacturing tolerances for the pulse generator 3. Such asymmetric position signals A and B are shown in FIG. 4 but the asymmetry is exaggerated for the purpose of clarity. As a result, timing pulses T (FIG. 4) derived from the flanks of these position signals A and B likewise exhibit different spacings. Despite uniform rotation of shaft 13 or uniform motion of object 11, the recordal of the existing value in the position counter 6 would therefore take place non-uniformly so that the regulating procedure is not stable or the desired value aimed at cannot be reached accurately. By reason of the frequency reduction of the timing pulses to one quarter, however, a uniform pulse spacing is obtained for the output timing pulses $T_4$ of the frequency divider 5 because, although in practice the scanning ratio of the position signals A and B can be different, its frequency or period is constant for a constant speed of the moved object. In addition, smaller counting capacities will suffice for the position counter 6 relatively to a position counter which executes a counting step for all or every second timing pulse (referred to the same maximum distance of the movable object to be counted).

In order that the binary counting counter 36 of the frequency divider 5 produces an output pulse $C_o$ (FIG. 2), upon every fourth timing pulse $\overline{T}$, or the frequency divider 5 produces an output timing pulse $T_4$ on every fourth timing pulse $\overline{T}$, the counter 36 is reset by each output timing pulse $T_4$ back to an initial value determined by the direction signal R by way of the presetting inputs $P_1$ to $P_4$, i.e. either to '0001' = 1 or '0100' = 4. On forwards counting, the count of counter 36 passes cyclically through the numeral sequence 1, 2, 3, 4, 1, 2, 3, 4, 1, 2, ... etc. in the decimal notation. Upon transition from '4' to '1', the counter 36 momentarily assumes the value '5' = '0101', at which the output signals $Q_1$ and $Q_3$ (FIG. 3) are both '1'. This is detected by the NAND element 38 by delivering an O signal $S_{38}$ which is fed, delayed by the delay element 39 by the period $t_3$ and inverted by the NAND element, to the resetting input P of counter 36 as a resetting pulse (or to the output of frequency divider 5 as an output timing pulse) $T_4$. This resets counter 36 to '1' ( = '0001') so that the timing step is continued with 1, 2, 3, ...

Upon backwards counting (R = '1'), the count of counter 36 runs reversely to the stated numeral sequence, i.e. in the sequence 4, 3, 2, 1, 4, 3, ... etc. Upon transition from '1' to '4', counter 36 produces an O pulse $C_o$ (FIG. 2) which is delayed by the period $t_3$ by the delay element 41 and inverted by the NAND element 40 so that the resetting or timing pulse $T_4$ occurs at the output of the NAND element 40, which initiates resetting of counter 36 and consequently determines the end of the O pulse $C_o$. The duration of the output timing pulse likewise corresponds to the delay period $t_3$.

The position counter 6 counts the timing pulses $T_4$ with which it is fed during the 1-signal R in the forwards direction and the timing pulses $T_4$ with which it is fed during the reverse signal R = 0 in the reverse direction so that the count of the position counter 6 corresponds to the existing value of the position of the movable object 11 at all times. This existing value is compared with the desired value in the regulator 1 set at the desired value generator 7 in order appropriately to regulate the position of the movable object 11 when there is a controlled departure.

We claim:

1. An incremental digital converter for converting two phase displaced signals of a pulse generator, which signals represent the position and direction of an object moved in two opposite directions, to a parameter which represents said position digitally, comprising, a reversible position counter, a signal generator which derives from said phase displaced signals a direction signal for determining the counting direction of said counter and timing pulses to be counted by said counter, said signal generator having flank detector means for deriving said timing pulses from each flank of one of said phase displaced signals, said signal generator having direction discriminator means utilizing said timing pulses and said phase displaced signals to derive said directional signal, said direction discriminator means having dual latch means, said phase displacement signals being respectively connected to the inputs of said latch means, a delay element between one of said latch means and one of said phase displacement signals, summating means receiving the outputs of said latch means, said flank detector means also producing said timing pulse from each flank of each of said phase displaced signals for the timing inputs of said latch means, a frequency divider dividing said timing pulses by four disposed between the output of said flank detector means and the timing pulse input of said reversible position counter.

2. A converter according to claim 1 characterised in that said frequency divider comprises a reversible pulse counter of which the counting direction input (U/D) is connected to the output of said direction discriminator.

3. A converter according to claim 1 characterized in that between the output of said flank detector means and the timing input of one of said latch means there is a delay element of which the delay period ($t_2$) is less than the delay period ($t_1$) of said first referred to delay element.

* * * * *